United States Patent [19]
Kawabata et al.

[11] Patent Number: 5,862,094
[45] Date of Patent: *Jan. 19, 1999

[54] SEMICONDUCTOR DEVICE AND A SEMICONDUCTOR MEMORY DEVICE

[75] Inventors: Kuninori Kawabata; Atsushi Hatakeyama, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 870,547

[22] Filed: Jun. 6, 1997

[30] Foreign Application Priority Data

Dec. 17, 1996 [JP] Japan .................................. 8-337338

[51] Int. Cl.$^6$ ........................................................ G11C 13/00
[52] U.S. Cl. ............................ 365/222; 365/194; 365/201
[58] Field of Search ................................. 365/222, 201, 365/194

[56] References Cited

U.S. PATENT DOCUMENTS

| | | | |
|---|---|---|---|
| 5,315,557 | 5/1994 | Kim et al. | 365/222 |
| 5,532,968 | 7/1996 | Lee | 365/222 |
| 5,535,169 | 7/1996 | Endo et al. | 365/222 X |
| 5,715,206 | 2/1998 | Lee et al. | 365/222 |

*Primary Examiner*—Do Hyun Yoo
*Attorney, Agent, or Firm*—Nikaido, Marmelstein, Murray & Oram, LLP

[57] ABSTRACT

According to the present invention, a semiconductor memory device includes an oscillator for generating with a predetermined cycle a timing signal for performing a refresh operation for the memory cell array. The oscillator includes an oscillation circuit, for receiving a predetermined characteristic value and generating the timing signal having the cycle in accordance with the characteristic value; a characteristic value generation circuit, having a programmable memory for generating an adjustment signal for an adjustment of the characteristic value, for transmitting to the oscillation circuit the characteristic value adjusted in accordance with the adjustment signal; and a confirmation switch for generating, instead of the memory, the adjustment signal for a test in accordance with a test entry signal.

7 Claims, 7 Drawing Sheets

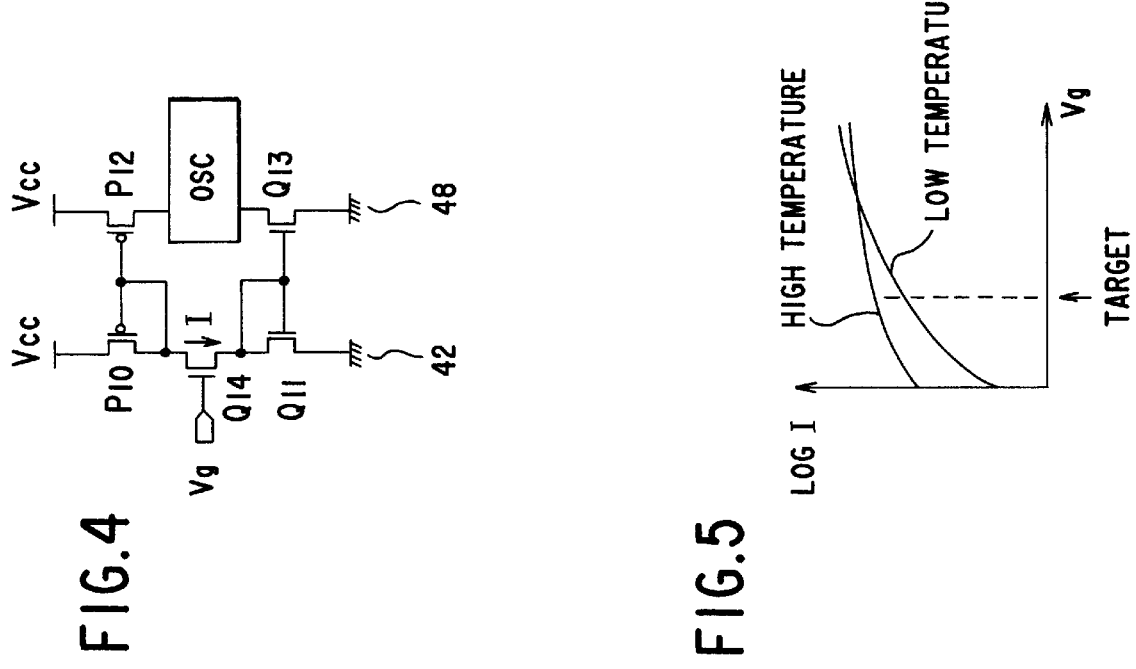
FIG.4
FIG.5
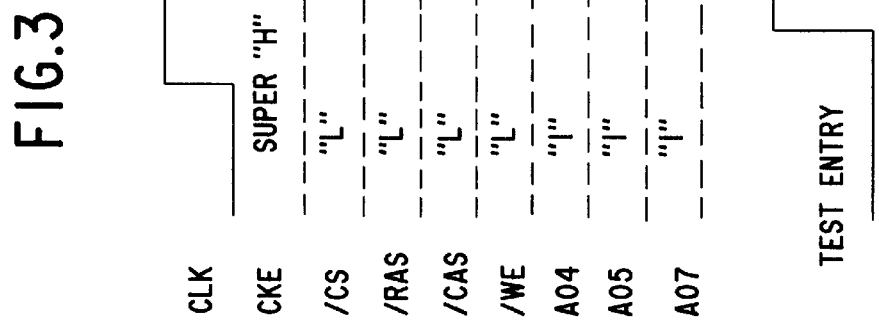
FIG.3

SEMICONDUCTOR DEVICE AND A SEMICONDUCTOR MEMORY DEVICE

BACKGROUND OF THE INVENTION

1. Field of the Invention

The present invention relates to a semiconductor device, such as a semiconductor memory device, for employing a ROM circuit to adjust the operational characteristics of a refresh counter and a delay circuit, for example, when they differ as a result of a manufacturing variance.

2. Related Arts

In a dynamic random access memory (DRAM), one type of semiconductor memory device, storage of data depends on whether electric charges are accumulated in memory cells or not in accordance with stored data. A memory cell in DRAM, which is most commonly employed, is constituted by one transistor and one capacitor. Electric charges are accumulated in the capacitor and the transistor is selected by a word line and a bit line.

Electric charges can be held in a DRAM memory cell for a predetermined period of time, and stored data can be precisely read therefrom. However, since the accumulated electric charge leaks from the capacitor of the memory cell, an inadequate electric charge is retained by the capacitor after the predetermined period of time has elapsed so that the stored data can not be precisely read. Thus, for DRAM, refresh operations are performed during which memory cells are accessed in a predetermined cycle and stored data are rewritten in the memory cells.

Recently, in order to reduce system load, a self-refresh function has been incorporated in DRAM, and data in memory cells are rewritten in the memory cell at a predetermined cycle by a refresh counter constituted by an internally provided oscillator.

With respect to another things, a clock signal delayed a predetermined time is generated by a delay circuit in a semiconductor circuit. The semiconductor circuit, for example, has a functional circuit determining whether an external clock signal is detected between an internal clock signal and the delayed clock signal.

It is inevitable that the above refresh counter and the delay circuit will be accompanied by manufacturing variances. Therefore, a programmable read only memory (PROM) for adjusting characteristic values is internally provided so that the manufacturing variances can be absorbed and characteristic values can be adjusted.

However, a great deal of time and labor is required to adjust characteristic values for using a PROM. In other words, an adjustment for a characteristic value and confirmation of a circuit operation must be repeated. The adjustment of a characteristic value is performed, for example, by employing an adjustment signal stored in the PROM to adjust the characteristic values affected by manufacturing variances. Confirmation of an operation is performed by examining an internal circuit thus adjusted to determine whether it operates correctly. When correct operation is not confirmed, another adjustment must be performed by employing the PROM circuit.

There are some adjustment PROMS, such as fuse ROMs, wherein data once written can not be corrected. If such a PROM is used for adjustment, it can not be programmed for re-adjustment. Therefore, when correct operation can not be confirmed following a first adjustment, a product will have a defect which can not be corrected.

SUMMARY OF THE INVENTION

It is, therefore, one object of the present invention to provide a semiconductor device wherein a programmable memory, for adjusting characteristic values affected by manufacturing variances, and a circuit for efficiently confirming a correct operation following the adjustment, are provided for a circuit which output characteristic values continuously varied as a result of manufacturing variances.

It is another object of the present invention to provide a semiconductor memory device wherein a programmable memory for adjusting a cycle, and a circuit for efficiently confirming a correct operation of the memory following the adjustment are provided for a refresh counter whose cycle is varied as a result of manufacturing variances.

It is an additional object of the present invention to provide a semiconductor device wherein a programmable memory for adjusting a delay and a circuit for efficiently confirming a correct operation of an internal circuit following an adjustment are provided for a delay circuit for changing a delay characteristic due to the manufacturing variance.

To achieve the objects, according to the present invention, a semiconductor memory device, having a memory cell array including a plurality of memory cells, comprises:

an oscillator for generating with a predetermined cycle a timing signal for performing a refresh operation for the memory cell array, the oscillator including an oscillation circuit for receiving a predetermined characteristic value and generating the timing signal having said cycle in accordance with the characteristic value, a characteristic value generation circuit, having a programmable memory for generating an adjustment signal for an adjustment of the characteristic value, for transmitting to the oscillation circuit the characteristic value adjusted in accordance with the adjustment signal, and a confirmation switch for generating, instead of the memory, said adjustment signal for a test in accordance with a test entry signal.

Further, according to the present invention, in the above semiconductor memory device, the characteristic value generation circuit includes a characteristic value generator for generating a plurality of characteristic values, and a selection switch for selecting, in accordance with the adjustment signal generated by the memory, one of the plurality of characteristic values generated by the characteristic value generator, one of the plurality of characteristic values is selected in accordance with the test adjustment signal which is provided by said confirmation switch when the test entry signal is at a test level, and data corresponding to the adjustment signal with which said refresh operation is correctly performed is stored in said memory.

To achieve the objects, according to the present invention, a semiconductor device comprises:

a delay circuit having different delay times as a result of manufacturing variances, the delay circuit including a first resistance and a plurality of selective second resistances, so that the delay times are generated by the first resistance or a combination of the first resistance and a selected second resistance;

adjustment signal generation circuit, having a programmable memory generating an adjustment signal for adjusting the delay time, for selecting the second resistances in accordance with the adjustment signal; and a confirmation switch, for giving, instead of the memory, said adjustment signal for a test to the delay circuit in accordance with a test entry signal.

In the above semiconductor device, one, or none, of the plurality of second resistances is selected in accordance with the test adjustment signal which is provided by said confirmation switch when the test entry signal is at a test level, and data corresponding to the adjustment signal with which said delay time for said delay circuit is correct is stored in the memory.

BRIEF DESCRIPTION OF THE DRAWINGS

FIG. 3 is a diagram illustrating an example of decision logic employed by a test mode discriminator;

FIG. 4 is a diagram for explaining the relationship between an oscillation circuit and a current source;

FIG. 5 is a graph showing the relationship between gate voltage Vg and drain current I of transistor Q14;

DETAILED DESCRIPTION OF THE PREFERRED EMBODIMENTS

The preferred embodiments of the present invention will now be described while referring to the accompanying drawings. It should be noted, however, that the technical scope of the present invention is not limited to these embodiments.

Figure 1:
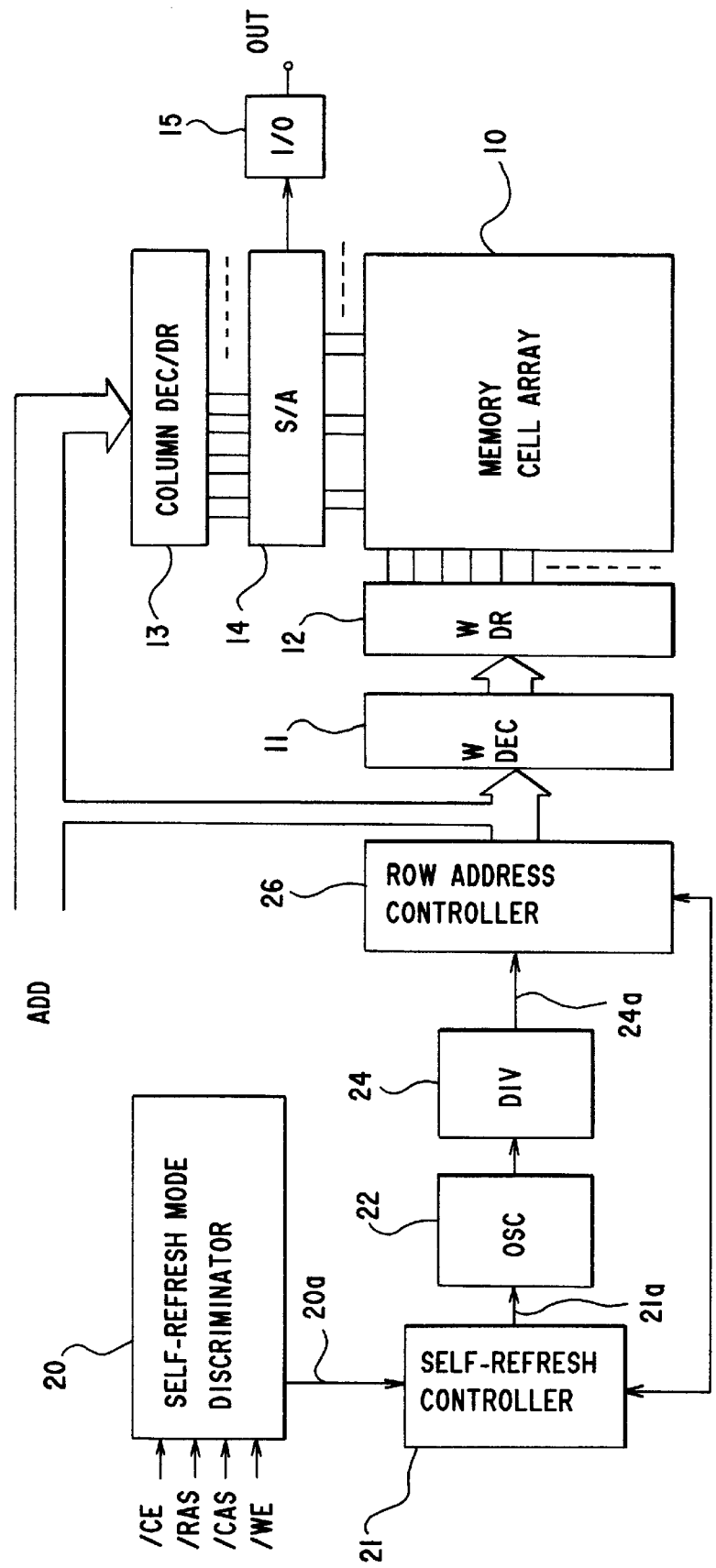
FIG. 1 is a schematic block diagram illustrating a semiconductor memory device according to one embodiment of the present invention.

FIG. 1 is a schematic block diagram illustrating a semiconductor memory device according to one embodiment of the present invention. A memory cell array 10 has a plurality of memory cells, dynamic memory cells in this embodiment. A word decoder 11 receives an external address signal ADD and a selected word line is driven by a word driver 12. A column decoder driver 13 selects bit lines in accordance with the address signal ADD. The outputs of a plurality of sense amplifiers 14 connected to selected bit lines are transmitted to an input/output circuit 15. For writing data, a write signal is sent by the input/output circuit 15 to bit lines selected by the decoder driver 13.

Such a dynamic random access memory requires a refresh operation for rewriting the data stored in its memory cells in a predetermined cycle. The refresh operation is performed by the system voluntarily transmitting an external refresh address signal to the memory, or in a cycle in accordance with a refresh timing signal that is internally generated when a self-refresh mode is detected by the memory side according to a control signal given by the system.

For the self-refresh operation performed by the memory side, an oscillator provided in the memory generates a refresh timing signal, and the reading of data from the memory and the re-writing of the data are performed in response to the timing signal. Therefore, the refresh timing signal has a cycle during which data can be rewritten without exceeding the period the data can be held in the memory cells. Preferably, the cycle should be as long as possible within a time range during which data in memory cells are not lost. This is because, when the data are rewritten at such a timing during a refresh process, minimum power is required to hold data in the memory cell.

In FIG. 1, a self-refresh mode discriminator 20 employs a chip enable signal /CE, a row address strobe signal /RAS, a column address strobe signal /CAS, and a write enable signal /WE, all of which are control signals, to determine a self-refresh mode. A self-refresh controller 21 controls a self-refresh operation performed at a predetermined timing in accordance with a self-refresh discrimination signal 20a generated by the self-refresh mode discriminator 20. An oscillator 22 starts oscillations in accordance with a self-refresh signal 21a generated by the self-refresh controller 21, and a frequency divider 24 divides the oscillation output and generates a refresh-timing signal 24a. In other words, the oscillator 22 and the frequency divider 24 constitute a refresh counter.

A row address controller 26 increments a row address signal in accordance with the timing for the refresh timing signal 24a, and transmits the row address signal to the word decoder 11. Then, word lines are driven sequentially, and memory re-writing is performed according to a normal memory operation.

Therefore, in the dynamic semiconductor memory device in FIG. 1, for a normal operation, an externally provided address signal ADD is decoded, a selected word line (not shown) is driven, the sense amplifiers 14 detect data accumulated in the memory cells, and the output of the sense amplifier 14, which is selected by the column decoder driver 13 in accordance with a column address, is transmitted to the input/output circuit 15.

For the self-refresh operation, a self-refresh mode is determined by the self-refresh mode discriminator 20, and the oscillator 22 starts oscillations at the timing of the self-refresh signal 21a generated by the self-refresh controller 21. Then, a row address signal is incremented in accordance with the cycle for the refresh timing signal 24a, a word line in the memory cell array is selected and driven in that cycle, and memory re-writing is performed. Generally, when the temperature is increased, the leak characteristic of a capacitor in a memory cell is deteriorated and the period the stored data are held is shortened. In order to compensate for this, it is commonly designated that the frequency of the oscillator 22 is increased as the temperature rises.

The data holding characteristic of the memory cell, however, varies as a result of manufacturing variances. Or, the characteristic value used for determining the frequency (cycle) of the oscillator is affected by manufacturing variances. A programmable ROM is provided so that the frequency of the oscillator can be adjusted while taking variances into consideration. Thus, after a product is manufactured it is subjected to an operation test to adjust it and to obtain an optimal characteristic value.

Figure 2:
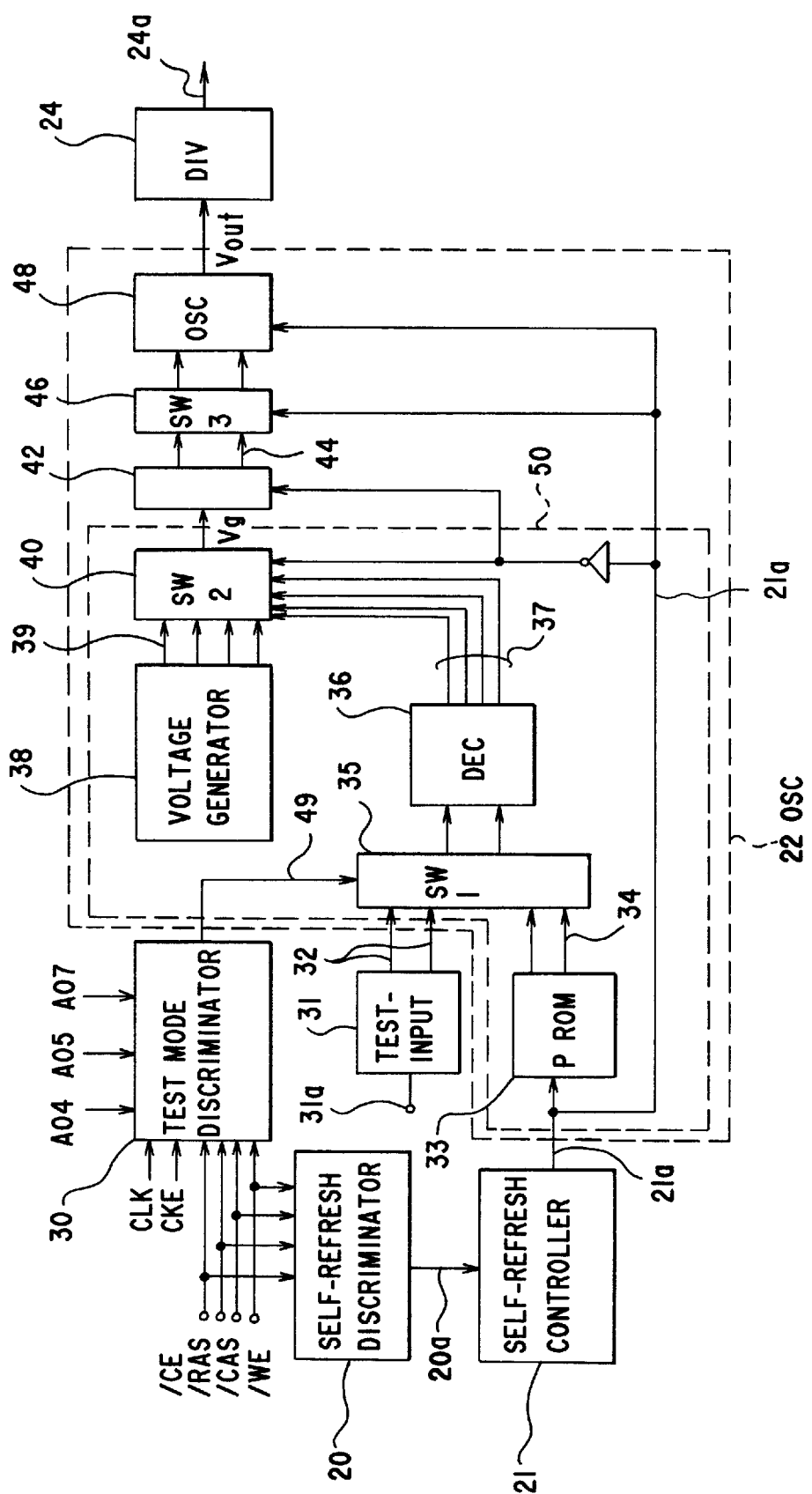
FIG. 2 is a block diagram illustrating the circuit structure of an oscillator and its periphery.

FIG. 2 is a block diagram illustrating the circuit structure of the oscillator 22 and its periphery. An oscillation unit including a current source 42, a switch 46 and an oscillation circuit 48 is provided in the oscillator 22. A voltage value Vg is supplied as a characteristic value to the oscillation unit to adjust a current value of the current source 42, and a current based on the voltage value Vg is generated by the current source 42. The current or the voltage used to generate the current is supplied to the oscillation circuit 48 via switching means 46, and the output of the oscillation circuit 48 is transmitted to the frequency divider 24 to generate a self-refresh timing signal 24a.

In addition, characteristic value generation means 50 is provided in the oscillator 22 to supply the characteristic value Vg to the current source 42, which is connected to the oscillation circuit 48. The characteristic value generation means 50 comprises memory means 33, consisting of a programmable ROM to generate adjustment signals 37 for adjusting the characteristic value Vg; a characteristic value generator 38 for generating a plurality of characteristic values; and a switch 35 which is confirmation switching means for providing, instead of the memory means 33, a test-in signal 32 as a test adjustment signal in response to a test entry signal 49.

In the characteristic value generation means 50, stored programmed data 34 is transmitted from the programmable ROM 33 to the decoder 36. The decoder 36 decodes the stored data 34 and outputs the adjustment signals 37. In this embodiment, since the output of the memory 33 is two bits, four decoded adjustment signals 37 are output. Of four characteristic values, for example, generated by a voltage generator 38 which is the characteristic value generator, one characteristic value is selected by a switch 40 in accordance with the adjustment signals 37, and a voltage value Vg which is the optimal characteristic value is supplied to the current source 42 connected to the oscillation circuit 48.

As is apparent from the above explanation, the oscillator 22 selects the voltage value Vg from a plurality of voltage values 39, which is the characteristic value for determining a frequency, in order to adjust the frequency (cycle) of the oscillation circuit 48 generating a self-refresh timing signal. The adjustment signals 37 used to select one of the voltage values 39 is set by storing data in the programmable memory 33. After the cycle of the self-refresh operation of a semiconductor memory device is confirmed, data are stored in the memory 33 for the selection of a voltage value corresponding to the confirmed optimal cycle. According to that, the cycle for the self-refresh operation can be adjusted to provide an optimal value while taking manufacturing variances into consideration.

The test mode discriminator 30 in FIG. 2 receives, for example, a clock CLK, a clock enable signal CKE, and address signals A04, A05 and A06, in addition to control signals /CE, /RAS, /CAS and /WE. When these signals provide a specific combination, the test entry signal 49 is generated. The switch 35, confirmation switching means, is changed in accordance with a test entry signal 49, and the test signal 32 is supplied to a decoder 36 instead of data from the memory 33.

That is, by changing the confirmation switching means 35 in accordance with the test entry signal 49, the test-in signal 32 from a test input signal generator 31 is provided instead of data from the memory 33. The voltage values 39 generated by the voltage generator 38 are selected in order to change the cycle for the oscillation circuit 48, and a test is conducted to determine whether the self-refresh operation will be performed at an appropriate timing. Then, data are written to the programmable memory 33 in order to obtain the optimal voltage value Vg detected in accordance with the test results. The test input signal generator 31 sequentially generates test signals 32 in accordance with an external control signal 31a, for example.

FIG. 3 is a diagram illustrating example discrimination logic employed by the test mode discriminator 30. When all of the control signals /CE, /RAS, /CAS and /WE go to level "0" or L, all of the address signals A04, A05 and A07 go to level "1" or H and the clock enable signal CKE goes to level super H, which is higher than the normal level H, and the test entry signal 49 goes active, i.e., goes to level "1" or H, at a rising timing for the clock CLK. As a result, the confirmation switching means 35 is changed.

FIG. 4 is a diagram for explaining the relationship between the oscillation circuit 48 and the current source 42. In FIG. 4, the switch 46 in FIG. 2 is not shown. In the current source 42, a P type transistor P10 and N type transistors Q11 and Q14 are connected between a ground potential and power Vcc. In the oscillation circuit 48, a specific oscillation circuit is provided between a P type transistor P12 and an N type transistor Q13. The transistors P10 and P12 constitute a current mirror circuit, as also do the transistors Q11 and Q13.

Current I is determined in accordance with voltage Vg applied to the gate of the transistor Q14. In other words, when the voltage Vg is high, the current I is also large, and when the voltage Vg is low, the current I is reduced. As a result, the current flowing across the transistor P12 constituting the current mirror circuit has a value according to the ratio of size relative to the transistor P10. The same procedure can be employed for the current flowing across the transistor Q13. Thus, when paired transistors P10 and P12 are the same size and paired transistors Q11 and Q13 are the same size, the current in the oscillation circuit will be the same as the current I.

The oscillation circuit is generally constituted by an odd number of inverters. As the supplied current is large, its operation is fast and its oscillation frequency is high. When the supplied current is small, its operation is slow and the oscillation frequency is low. Therefore, the oscillation frequency is controlled in accordance with the voltage Vg which is the characteristic value to be supplied.

FIG. 5 is a graph showing the relationship between the gate voltage Vg and the drain current I of the transistor Q14. As the general sub-threshold characteristic of the transistor, the drain current I is large when the temperature is high, and is small when the temperature is low. It is possible, therefore, by setting the gate voltage as a target voltage value in FIG. 5, to provide an automatic control that will increase the oscillation frequency at a high temperature and reduce it at a low temperature. In the dynamic memory, a leak current from a capacitor is large at a high temperature, and thus, the length of the self-refresh period must be reduced. Therefore, delicate adjustments for the oscillation frequency affected by a temperature change can be automatically performed by utilizing the transistor characteristic shown in FIG. 5.

Figure 6:
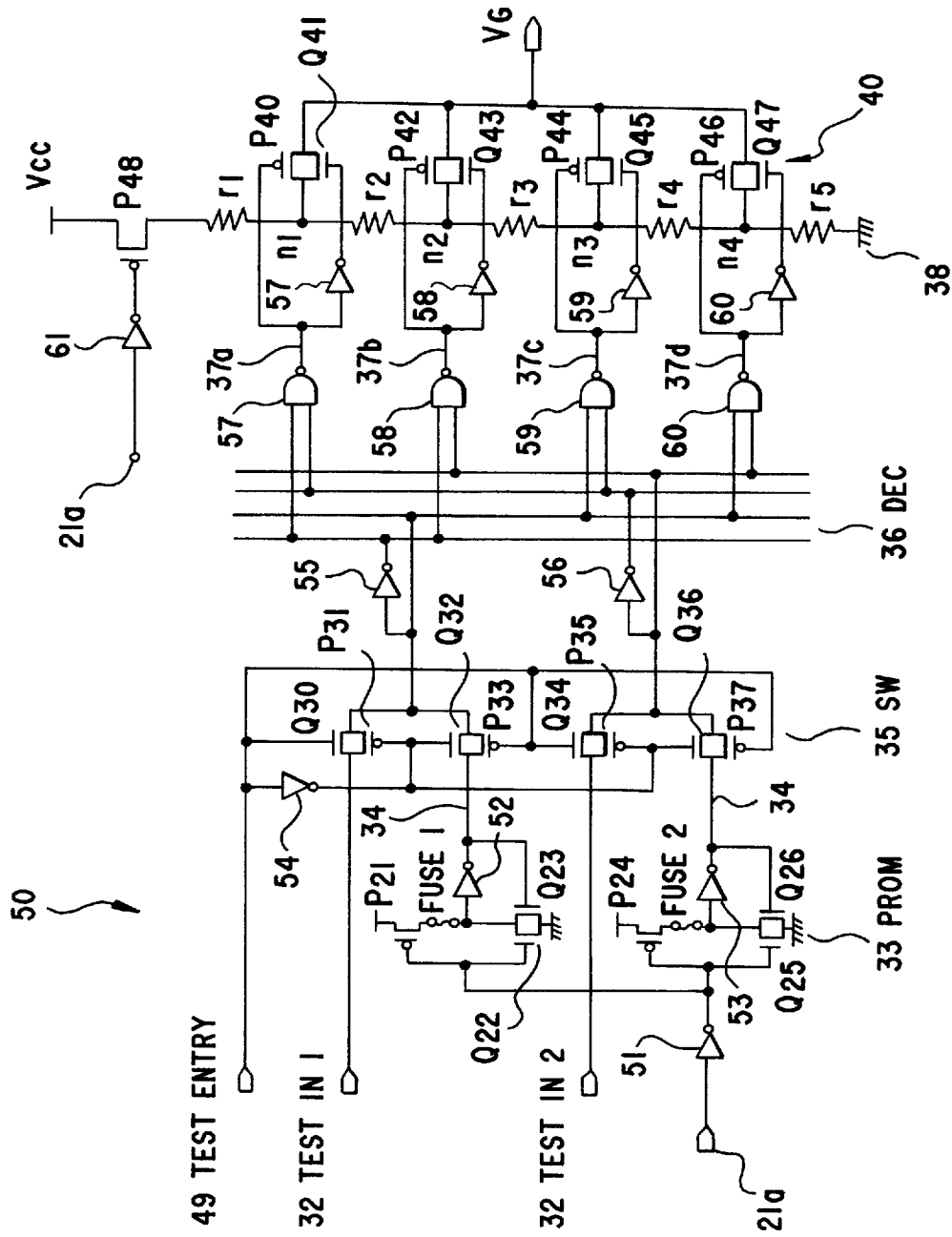
FIG. 6 is a specific circuit diagram illustrating characteristic value generation means.

FIG. 6 is a specific circuit diagram illustrating the characteristic value generation means 50. The programmable memory means 33 in the characteristic value generation means 50 is constituted by a two-bit fuse ROM. More specifically, a fuse Fuse 1 is provided in a memory cell constituted by a P transistor P21, N transistors Q22 and Q23, and an inverter 52. Further, a fuse Fuse 2 is provided in another memory cell constituted by a P transistor P24, N transistors Q25 and Q26, and an inverter 53.

The memory 33 is activated by the self-refresh signal 21a. In other words, in the circuit shown in FIG. 6, when the self-refresh signal 21a is at level L, the memory 33 is in a non-active state. That is, the output of the inverter 51 goes to level H, the transistors Q22 and Q25 are turned on, and the outputs of the inverters 52 and 53 go to level H, regardless of the conditions of the fuses. And the transistors Q23 and Q26 to which these outputs are fed back are also turned on. Thus, in the non-active state, both outputs 34 of the memory 33 go to level H.

The self-refresh signal 21a is transmitted via an inverter 61 to the gate of a P transistor P48 in the voltage generator 38. In the voltage generator 38, normally, the transistor P48 is turned on and supplies a current so that the voltages divided by resistors r1 through r5 are generated at nodes n1 through n4. In the non-active condition, however, in accordance with the level L self-refresh signal 21a, the transistor P48 is turned off and the voltage at nodes n1 through n4 falls ground potential. In other words, the voltage Vg is reduced to ground potential, and as is apparent from FIG. 4, no current is supplied to the oscillation circuit 48 so that the counter function is thereby halted.

When the self-refresh signal 21a is at level H, the operation condition becomes active. In the memory 33, the gates of the P transistors P21 and P24 go to level L, and the outputs of the inverters 52 and 53 are maintained at level H, or go to level L in accordance with the conditions of the fuses Fuse 1 and Fuse 2. That is, when fuses of a melting type are cut by a laser beam, the inputs to the inverters 52 and 53 are maintained at level L and their outputs are maintained at level H by turning on the transistors Q23 and Q26, which are in the non-active state. On the other hand, when the fuses are not cut, the inputs to the inverters 52 and 53 go to level H and the outputs 34 of the memory 33 goes to level L.

The switch 35 is the switching means for confirming the operation, as was previously described. Normally, CMOS switches Q32 and P33, and Q36 and P37 are turned on in accordance with the test entry signal 49 of level L, and the outputs 34 of the memory 33 are supplied to the decoder 36. As a result, the two-bit outputs 34 are decoded by the decoder 36, and one of four voltage value adjustment signals 37a through 37d is selected (level L). The decoder 36 is constituted by inverters 55 and 56 and NAND circuits 57 though 60.

One of four CMOS switches P40 to Q47 is turned on in accordance with the selected adjustment signal 37a to 37d, and the voltage value at one of the corresponding nodes n1 to n4 is output as the output voltage value Vg. In the voltage generator 38, the resistors r1 and r5 have comparatively large resistances, and the power voltage Vcc is divided at a predetermined resistance ratio, so that the voltage values obtained at the nodes n1 through n4 are shifted and have slight voltage differences. In other words, resistors r2, r3 and r4 have comparatively small resistances.

As is described above, since the data with which an appropriate voltage value Vg can be selected is stored in the memory 33, different voltage values for the nodes n1 through n4 can be selected as output voltages Vg. Thus, after the appropriate voltage is confirmed, adjustment data are written to the memory 33.

However, if after the adjustment data have been stored in the memory 33 it is ascertained by examining the memory operation that an appropriate refresh operation is not being performed, it is difficult to rewrite the data in the memory 33. This is because once data are written in a memory 33 employing a melting type fuse, for example, different data can not be written over.

Therefore, before the adjustment data is written to the memory 33, the confirmation switching means 35 is switched to the test-in signal side 32 in accordance with the test entry signal 49. As is shown in FIG. 2, under the control exercised via an external terminal 31a, the test input signal generator 31 generates test-in signals 32 that continuously change, and transmits them to the decoder 36. The test-in signals 32 are employed to generate the adjustment signals 37a through 37d for selecting a voltage value at one of the nodes n1 through n4. Then, the self-refresh operations of the semiconductor memory devices are examined to determine whether they are correct.

The same data as the data for the test-in signals 32 when the correct self-refresh operation is confirmed are written in the programmable memory 33. As a result, the optimal voltage value Vg is selected by the data set in the memory 33.

Figure 7:
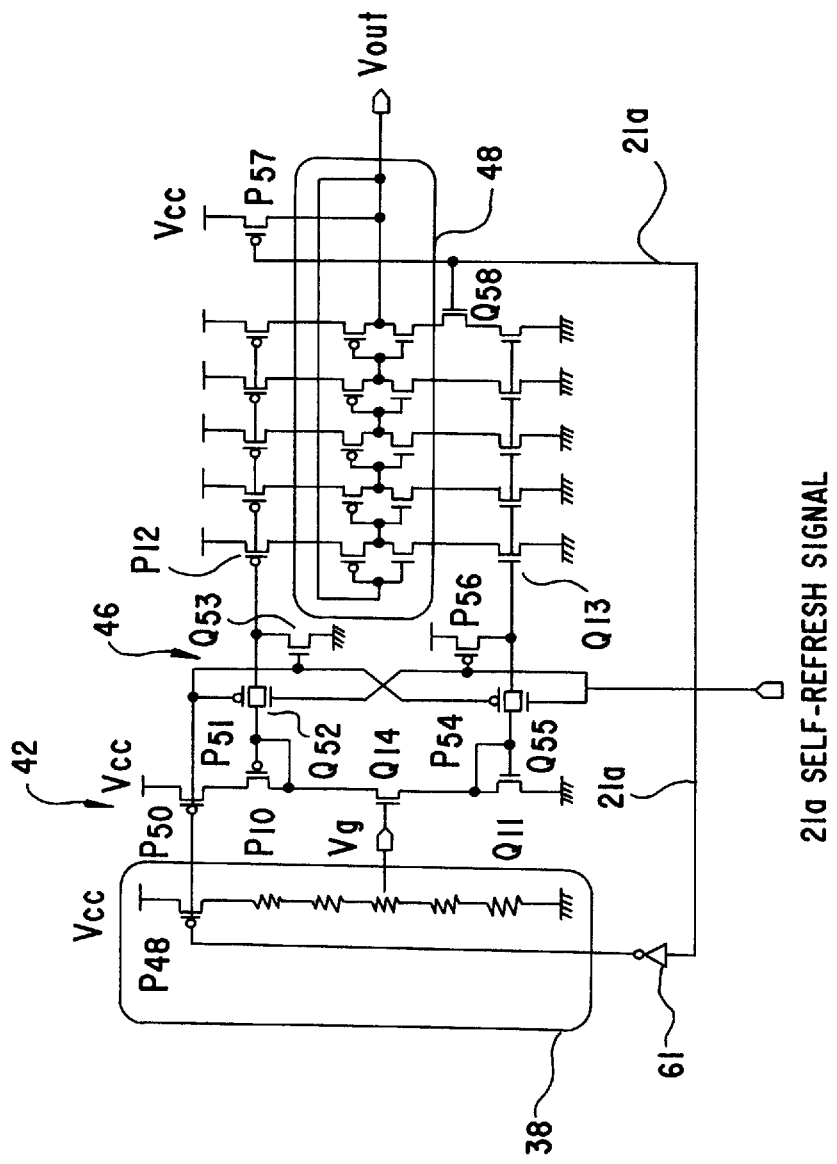
FIG. 7 is a specific circuit diagram illustrating the oscillation circuit in the oscillator.

FIG. 7 is a specific circuit diagram illustrating the oscillation circuit portion in the oscillator 22. The circuit in FIG. 7 differs from the schematic circuit structure of the current source 42 and the oscillation circuit 48 in FIG. 4 in that a P type transistor P50 for activation is provided for the current source 42, and an activation switch 46 is provided between the current source 42 and the oscillation circuit 48. Transistors Q53, P56, P57 and Q58 are employed to render the oscillation circuit 48 active.

First, when the self-refresh signal 21a is at level L, a non-active level, both the P type transistors P48 and P50 are turned off, and the current route between the voltage generator 38 and the current source 42 is cut. In addition, CMOS switches P51, Q52, P54 and Q55 in the switch circuit 46 are turned off, and the current mirror circuit constituted by the transistors P12 and Q13, which is the current supply for the oscillation circuit 48, is interrupted. The gate potentials of the transistors P12 and Q13 are fixed at a ground level and a power voltage level, respectively through the transistors Q53 and P56. Further, the transistor P57 is turned on and the transistor Q58 is turned off in accordance with the self-refresh signal 21a, and the output of the oscillation circuit 48 is forcibly fixed at the level of power voltage Vcc. In other words, output Vout is fixed at level H and the oscillation clock signal Vout is not generated.

When the self-refresh signal 21a is at level H, an active level, the transistors P48 and P50 are turned on. In addition, the transistors of the switch 46 are turned on, the transistor P57 for the oscillation circuit 48 is turned off, and the transistor Q58 is turned on. The oscillation circuit 48 having five CMOS inverters outputs a signal having a frequency corresponding to the voltage value Vg.

Figure 8:
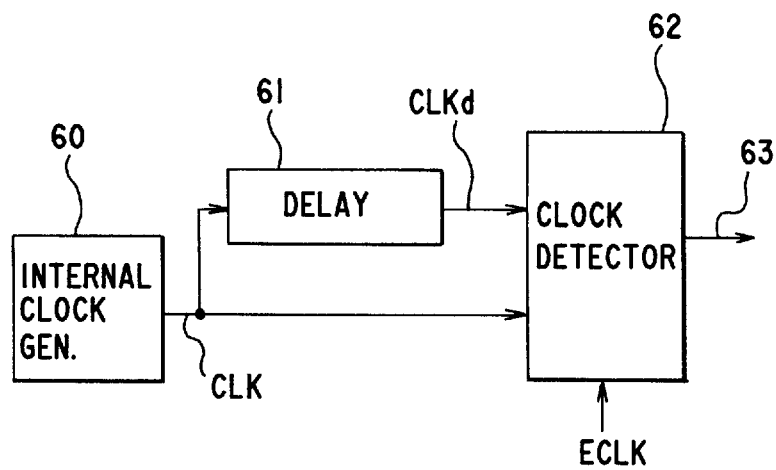
FIG. 8 is a circuit diagram illustrating another embodiment of the present invention.

FIG. 8 is a circuit diagram illustrating another embodiment of the present invention. In this embodiment, an internal clock CLK generated by an internal clock generator 60 is transmitted to a delay circuit 61 which in turn generates a delayed signal CLKd. A clock detector 62 determines whether or not an external clock ECLK is inserted between the clock signals CLK and CLKd. The clock detector 62 then outputs a detection signal 63.

Figure 9:
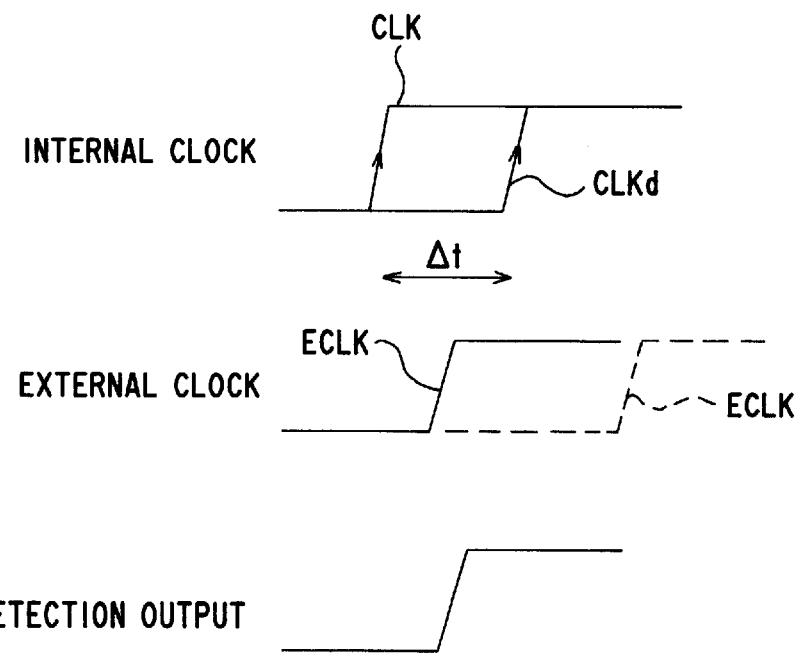
FIG. 9 is a timing chart for the embodiment in FIG. 8.

This process is performed in accordance with the timing chart shown in FIG. 9. The clock detector 62 determines whether or not the external clock ECLK is received during a delay time Δt generated by the delay circuit 61. At this time, the delay time Δt must be adjusted precisely. The delay time for the delay circuit is varied as a result of manufacturing variances, for example. In this case, as in the above described refresh circuit, a programmable memory is provided so that the delay time Δt, which is a characteristic value, can be selected by the memory data for adjustment.

Figure 10:
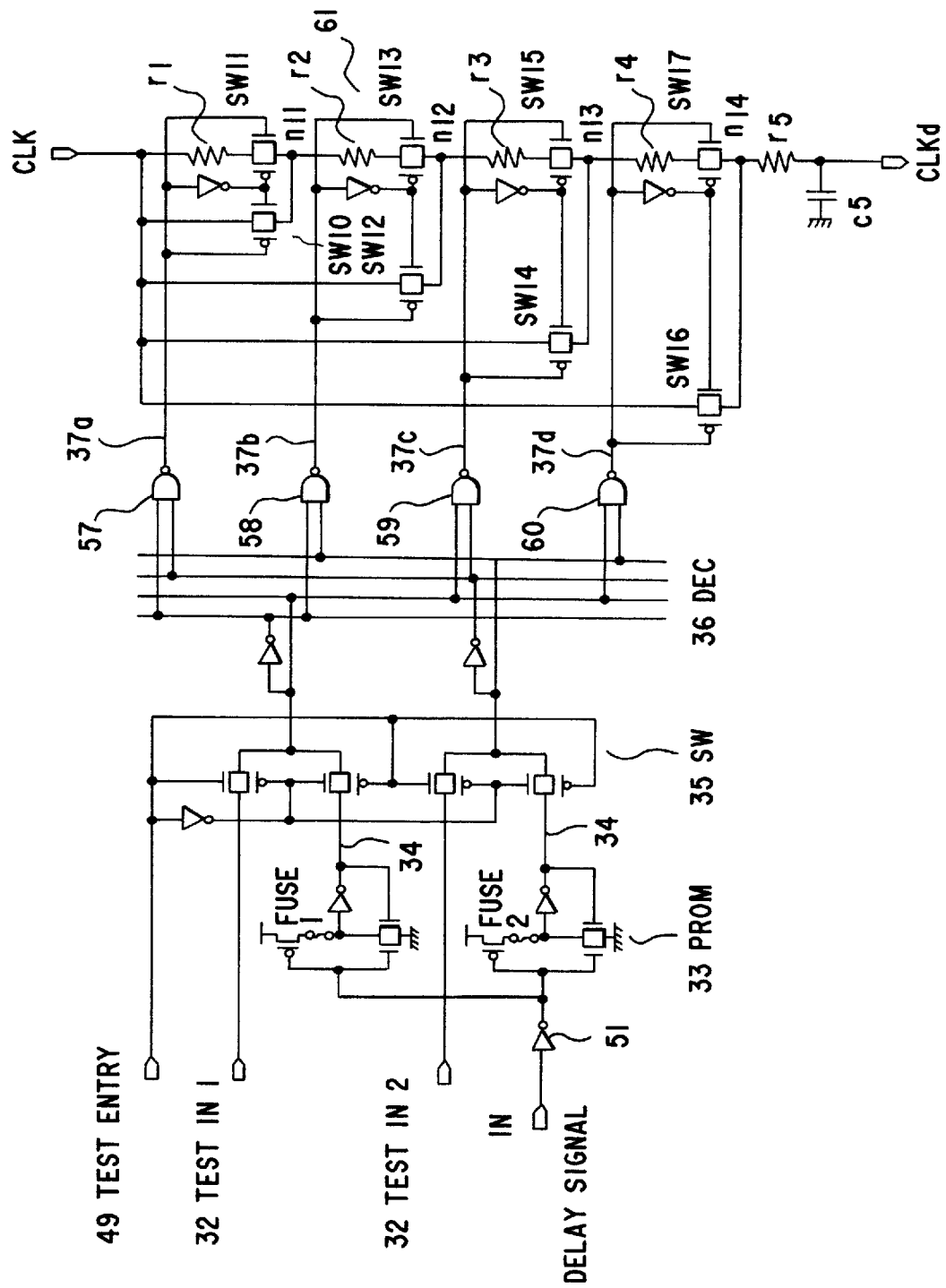
FIG. 10 is a specific circuit diagram illustrating a delay circuit.

FIG. 10 is a specific diagram illustrating the delay circuit 61. Since a programmable memory 33, an operation confirmation switching means 35, and a decoder 36 in this circuit structure are the same as those in FIG. 6, the same reference numerals are used to denote corresponding components and no explanation for them will be given. Relative to FIG. 8, the internal clock CLK is delayed for a predetermined time by resistor r5 and capacitor C5, thus providing a delayed internal clock CLKd. Then, for the detailed adjustment of the delay time Δt, comparatively small resistors r1 through r4 are connected, as needed, to CR circuits r5 and C5 by switches SW10 through SW17.

As was previously described, the outputs of the memory 33 are decoded, and one of the four adjustment signals 37a through 37d goes to level L which is the selected level. When the adjustment signal 37a goes to level L, for example, the switch SW10 is turned on and the switch SW11 is turned off. The switches SW13, SW15 and SW17 are also turned on so that the longest delay time is generated by the resistors r2, r3 and r4, and the CR circuit composed of r5 and C5. When an adjustment signal 37b goes to level L, the switch SW10 is turned off and the switches SW12, SW15 and SW17 are turned on so that the second longest time is generated by the resistors r3 and r4 and the CR circuit composed of r5 and C5.

In the above described manner, the delay time is adjusted in detail by the adjustment signal 37. Thus, while the test entry signal 49 is set at level H and data are being sequentially changed in accordance with the test-in signal 32, the operations of the internal circuits, such as the clock detector 62, are examined. The same data as that carried by the test-in signal 32 when the optimal delay time is obtained are written to the memory 33. In this manner, before adjustment data are written to the memory 33, the operation of the internal circuit can be confirmed while the delay time is adjusted in accordance with the test entry signal, and later, appropriate data can be written to the memory 33.

As is described above, according to the present invention, when characteristic values and operational conditions of the internal circuit are varied as a result of manufacturing variances, before data are written to a programmable memory for generation of variance adjustment signals, test data that can be externally controlled are input by the operation confirmation switching means so that the internal operation can be confirmed. Therefore, the data used for adjustment, which is obtained after the operation is confirmed, can be written to the memory, and the procedures for confirming the correct operation and for writing data to the memory can be efficiently performed.

What is claimed is:

1. A semiconductor memory device, having a memory cell array including a plurality of memory cells, comprising:

an oscillator for generating a timing signal with a cycle, utilized for a refresh operation for said memory cell array, said oscillator including an oscillation circuit, receiving a characteristic value, for generating said timing signal having said cycle in accordance with said characteristic value, a programmable memory for generating an adjustment signal for adjusting said characteristic value, a switch, receiving said adjustment signal and a test signal, for outputting the test signal as said adjustment signal in accordance with a test entry signal, and a characteristic value generation circuit, receiving said adjustment signal, for outputting said characteristic value in accordance with said adjustment signal to said oscillation circuit.

2. A semiconductor memory device according to claim 1, wherein said characteristic value generation circuit includes a characteristic value generator for generating a plurality of characteristic values, and a selection switch for selecting, in accordance with said adjustment signal, one of said plurality of characteristic values.

3. A semiconductor memory device according to claim 2, wherein each of said characteristic values is a voltage value, and said oscillation circuit operates according to a current corresponding to said voltage value selected by said selection switch, and generates the timing signal having said cycle in accordance with a value of said current.

4. A semiconductor device comprising:

a delay circuit having a plurality of resistors, for outputting a delay signal having a delay time which is generated by one of said plurality of resistors or a combination of said plurality of resistors;

a programmable memory generating an adjustment signal for adjusting said delay time and a switch, receiving said adjustment signal and a test signal, for outputting said test signal as an adjustment signal to said delay circuit in accordance with a test entry signal, wherein selection of said plurality of resistors is performed in response to said adjustment signal.

5. A semiconductor device comprising:

a characteristic value generation circuit for generating one of different characteristic values in accordance with an adjustment signal;

an internal circuit for receiving said characteristic value from said characteristic value generation circuit and having a predetermined operational characteristic in accordance with the characteristic value;

a programmable memory for storing said adjustment signal; and a switch, receiving said adjustment signal and a test signal, for outputting the test signal as said adjustment signal to said characteristic value generation circuit according to a test entry signal.

6. A semiconductor device according to claim 5, further comprising a memory cell array including a plurality of memory cells, wherein said internal circuit has an oscillator for generating a timing signal with a cycle responsive to said characteristic value, for a refresh operation for said memory cell array.

7. A semiconductor device according to claim 6, wherein said characteristic value is selected in accordance with said test signal which is provided by said switch when said test entry signal is at a test level.

* * * * *